(12) United States Patent
Shroff et al.

(10) Patent No.: US 6,717,269 B2
(45) Date of Patent: Apr. 6, 2004

(54) INTEGRATED CIRCUIT DEVICE HAVING SIDEWALL SPACERS ALONG CONDUCTORS

(75) Inventors: Mehul Shroff, Austin, TX (US); Gerald G. Benard, Austin, TX (US); Philip Grigg, Cedar Park, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/350,852

(22) Filed: Jan. 24, 2003

(65) Prior Publication Data

US 2003/0143832 A1 Jul. 31, 2003

Related U.S. Application Data

(63) Continuation of application No. 09/918,429, filed on Jul. 27, 2001, now Pat. No. 6,583,043.

(51) Int. Cl.[7] .......................... H01L 23/48; H01L 23/52; H01L 29/40
(52) U.S. Cl. .......................... 257/758; 257/760; 257/774
(58) Field of Search .................. 257/751, 752, 257/758, 760, 773, 774, 775

(56) References Cited

U.S. PATENT DOCUMENTS

| | | |
|---|---|---|
| 5,486,493 A | 1/1996 | Jeng |
| 5,510,645 A | 4/1996 | Fitch |
| 5,708,303 A | 1/1998 | Jeng |
| 5,721,621 A | 2/1998 | Komaki |
| 5,880,018 A | 3/1999 | Boeck |
| 6,090,696 A | 7/2000 | Jang |
| 6,143,646 A | 11/2000 | Wetzel |
| 6,207,556 B1 * | 3/2001 | Hsu ............................ 438/637 |
| 6,355,563 B1 * | 3/2002 | Cha et al. .................... 438/687 |
| 2001/0035547 A1 | 11/2001 | Isogai |
| 2002/0019121 A1 | 2/2002 | Pyo |

FOREIGN PATENT DOCUMENTS

| | | |
|---|---|---|
| EP | 0834916 A3 | 4/1998 |
| EP | 0834916 A2 | 4/1998 |
| WO | WO 99/63591 A1 | 12/1999 |
| WO | WO 00/19523 A1 | 4/2000 |
| WO | WO 00/38237 A1 | 6/2000 |
| WO | WO 00/41224 A2 | 7/2000 |

* cited by examiner

*Primary Examiner*—Phat X. Cao
*Assistant Examiner*—Hoai Pham
(74) *Attorney, Agent, or Firm*—Kim-Marie Vo; James L. Clingan, Jr.

(57) ABSTRACT

Two conductors of the same layer are separated by a low-K dielectric to minimize capacitance between them. The first and second conductors may have sidewalls with conductive barriers. The conductive barriers are separated from the low-K dielectric by spacers. The dielectric spacers have a top portion and a lower portion in which the top portion may have a higher dielectric constant than the lower portion or may be the same material. The two conductors are formed in trenches in a convenient dielectric. Prior to forming the conductors, the conductive barriers are deposited in the trench. After the conductors are formed, the convenient dielectric is removed. The dielectric spacers are formed adjacent to the conductive barriers. The low-K dielectric is then deposited adjacent to the dielectric spacers and not in contact with the conductive barriers.

9 Claims, 4 Drawing Sheets

INTEGRATED CIRCUIT DEVICE HAVING SIDEWALL SPACERS ALONG CONDUCTORS

This is a CON of Application No. 09/918,429 filed Jul. 27, 2001, now U.S. Pat. No. 6,583,043.

FIELD OF THE INVENTION

This invention relates, in general, to semiconductor processing and, more specifically, to forming a dielectric between metal structures.

BACKGROUND OF THE INVENTION

As integrated circuit (IC) device dimensions shrink, spacing between metal lines is reduced leading to higher parasitic capacitance and consequently, increased signal delay. This has led to the development of low dielectric constant (low-K) materials for use as the dielectric between these metal lines. As used herein, low-K materials refer to materials with dielectric constants less than that of silicon dioxide, which is about 4.0. Low-K materials are often less than 3.5 or even less than 3.0. High-K materials refer to materials with dielectric constants greater than that of silicon dioxide and are commonly greater than 4.2 or even greater than 4.5. With low-k materials being used to decrease the parasitic capacitance, some problems have been encountered. For example, low-K materials suffer from lower mechanical strength than conventional higher-K materials. In addition, many low-K materials do not adequately adhere to other conventional IC materials. Unlike traditional dielectric materials, patterning low-K materials results in deformed etch profiles due to the material's mechanical and thermal instability. One solution is to use a patternable dielectric layer to form metal structures and subsequently remove the dielectric layer and replace the patternable dielectric layer with a low-K dielectric. The replacement low-K dielectrics, however, have been found to result in reduced mechanical strength and poor adhesion. Therefore, a process for replacing the patternable dielectric layer with a low-K dielectric that does not decrease mechanical strength and does not have poor adhesion is needed.

BRIEF DESCRIPTION OF THE DRAWINGS

The present invention is illustrated by way of example and is not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE INVENTION

Generally, a method for forming an interconnect structure in an IC device, wherein RC time delays or cross talk between adjacent metal lines is reduced, is described. A low-K material is formed between two metal structures or interconnects. To increase reliability, in one embodiment, a dielectric layer is formed between the low-K material and the metal structure as a barrier/adhesion layer. In another embodiment, the barrier/adhesion layer is a combination of two different materials, such as two different dielectric materials. In another embodiment, a spacer region is formed from the sacrificial dielectric layer and serves as a barrier/adhesion layer between the low-K material and the conductive regions. This select placement of a barrier/adhesion layer in conjunction with a low-K material between conductive regions improves thermal dissipation and mechanical strength while preserving the advantage of improved isolation associated with the low-K material. The invention is better understood by turning to the figures and is defined by the claims.

Figure 1:
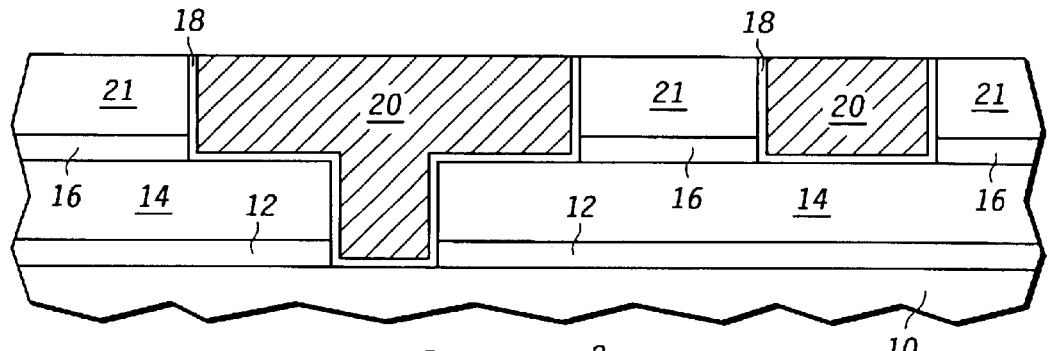
FIG. 1 is a cross-section of a portion of a semiconductor substrate illustrating metal structures in accordance with embodiments of the present invention.

Shown in FIG. 1 is a starting point for several embodiments of the invention. More particularly, shown in FIG. 1 is a portion of an integrated circuit device structure 2 comprised of a semiconductor substrate 10, a first etch stop layer (ESL) 12, a first dielectric layer 14, a second etch stop layer 16, a conductive barrier layer 18, a conductor 20, and a second dielectric layer 21. The semiconductor substrate 10 is, preferably, monocrystalline silicon, but can also be gallium arsenide, silicon germanium or the like and may be over an insulator as in silicon-on-insulator (SOI).

As shown in FIG. 1, the first dielectric layer 14 is formed over the first etch stop layer 12. The first dielectric layer 14 can be any suitable dielectric material. More specifically, the first dielectric layer 14 can be silicon dioxide formed using tetraethylorthosilicate (TEOS) gas, fluorine-doped silicon dioxide, borophosphosilicate glass (BPSG), phosphosilicate glass (PSG), plasma enhanced nitride (PEN), spin-on glasses (SOGs), silane glasses, the like and combinations thereof. The etch stop layer 12 can include any one or more of PEN, silicon oxynitride, other dielectrics comprising nitrogen or the like. The etch stop layer 12 can serve as an etch stop for reactive ion etching (RIE) or wet etching, anti-reflective coatings for photolithography, corrosion protection, and contamination protection.

The second etch stop layer 16 is formed over the first dielectric layer 14 and can be any material or serve any function mentioned for the first etch stop layer 12. Formed over the second etch stop layer 16, the second dielectric layer 21 can be any suitable dielectric material, such as any material disclosed for first dielectric layer 14. It is not necessary, however, that the first etch stop layer 12 and the second etch stop layer 16 or the first dielectric layer 14 and the second dielectric layer 21 be the same materials. Layers 12, 14, 16 and 21 can be formed by chemical vapor deposition (CVD), physical vapor deposition (PVD), atomic layer deposition (ALD), spun-on, the like, or combinations thereof.

The first etch stop layer 12, the first dielectric layer 14, the second etch stop layer 16, and the second dielectric layer 21, also referred to as the sacrificial dielectric layer 21, are patterned using conventional lithographic and etching techniques. In one embodiment, the first etch stop layer 12, the first dielectric layer 14, the second etch stop layer 16, and the second dielectric layer 21 are simultaneously patterned and etched using a plasma etch chemistry comprising a fluorinated etch species. For example, the layers 12, 14, 16, and 21 may be patterned in a plasma environment which is generated using etch gases such as $CHF_3$, $CF_4$, $C_2F_6$ or the like, alone or in combination. Alternately, the patterning of each layer can be performed separately. This etch process forms openings, or more specifically interconnect openings, which are subsequently filled or deposited with a conductor 20 or metal conductor 20 and, optionally, a conductive barrier layer 18. In one embodiment, the conductor 20 is copper and the conductive barrier layer 18 is a stack of tantalum nitride and tantalum. Alternately, the conductor 20 can be any conductive material or metal, such as aluminum, an aluminum alloy (aluminum copper, aluminum silicon, aluminum silicon copper), silver, gold, copper alloy, or the like, and the conductive barrier layer can be tantalum, titanium, titanium nitride, combinations of the above, or the like. The conductor 20 and the conductive barrier layer 18 are deposited by CVD, PVD, electroplating, combinations of the above, and the like, and are planarized by chemical mechanical polishing (CMP) or an etch-back. After planarization, the top surfaces of the metal tend to be concave due to the CMP process, but nonetheless are substantially coplanar to each other. The interconnects are used to make electrical contact/interconnection to an underlying conductive region such as another metal layer or a doped semiconductive region within a polysilicon layer or the semiconductor substrate. The doped region may be a gate, bipolar electrode, well contact, source/drain, thin film transistor (TFT) node or the like.

FIRST EMBODIMENT

Figure 2:
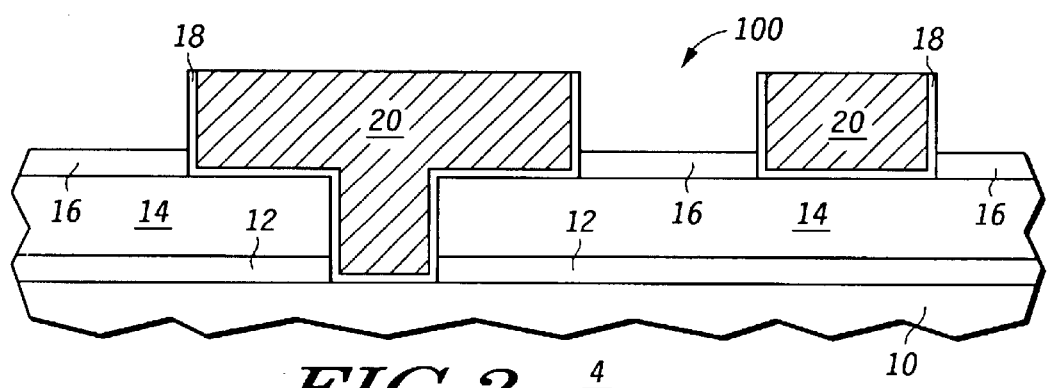
FIG. 2 is a cross-section of a portion of a semiconductor substrate illustrating removing a second dielectric layer in accordance with a first and second embodiments of the present invention.
Figure 3:
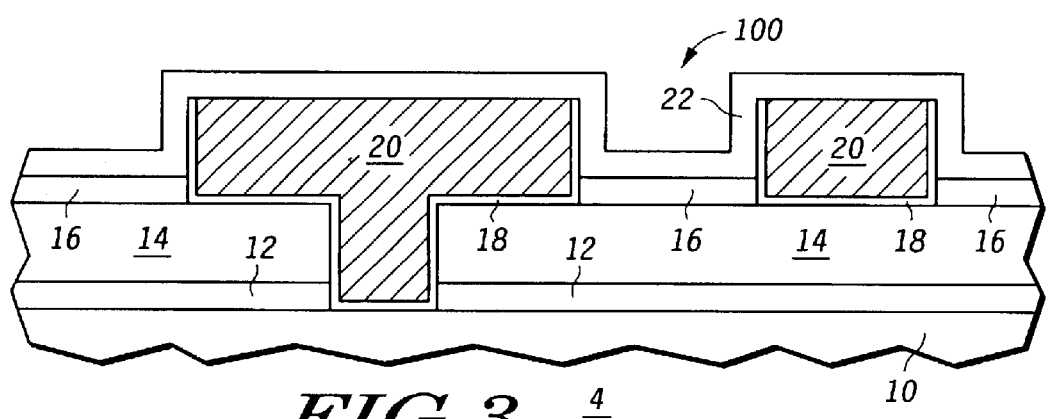
FIG. 3 is a cross-section of a portion of a semiconductor substrate is illustrating forming a cap layer in accordance with the first and second embodiments of the present invention.
Figure 4:
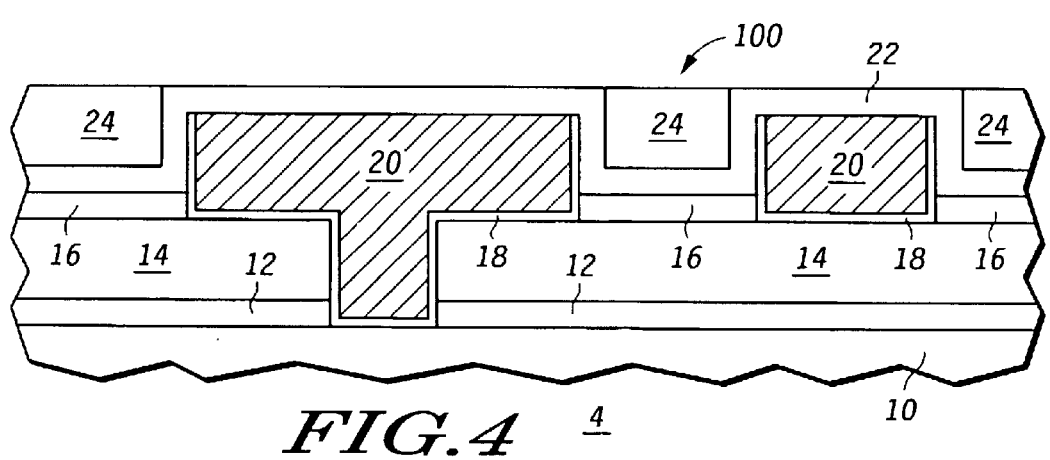
FIG. 4 is a cross-section of a portion of a semiconductor substrate illustrating forming a third dielectric layer in accordance with the first embodiment of the present invention.

Shown in FIGS. 2–4 is an integrated device structure 4 in consecutive stages of development following the device structure 2 of FIG. 1 as a first embodiment of the invention. Shown in FIG. 2, after remaining portions of the second dielectric layer 21 are removed using a wet or dry etch process in order to expose the second etch stop layer 16, a first sidewall of the conductive barrier layer 18 of a first metal interconnect and a second sidewall of the conductive barrier layer 18 of a second metal interconnect, is an opening 100. The etch used should be selective to the conductor 20, the conductive barrier layer 18 and the second etch stop layer 16. If the second dielectric layer 21 is $SiO_2$ formed using TEOS gas, an example of such a chemistry is a fluorinated species like $CF_4$ $CHF_3$, and $C_2F_6$.

Shown in FIG. 3 is a cap layer 22 that is deposited over semiconductor substrate 10 by CVD, plasma enhanced chemical vapor deposition (PECVD), atomic layer deposition (ALD) or the like. The thickness of the cap layer 22 should be less than the difference between the top of the interconnect feature and the top of the etch stop layer 16. Preferably the cap layer 22 is a non-conductive nitride, such as a silicon nitride, silicon-rich nitride, silicon oxynitride, or silicon-rich oxynitride. Any other suitable material can be used.

As shown in FIG. 4, a third dielectric layer 24 is deposited by CVD, ALD or by a spin-on process. Generally, after deposition a planarization etch or a CMP process is performed to planarize the third dielectric layer 24 so that the cap layer 22 and the top surface of the third dielectric layer 24 are coplanar. The third dielectric layer is preferably a low-K material. Some low-K materials include SiCOH, spin-on-glasses (SOG), aerogel, xerogel and the like. Some spin-on glasses that can be used include hydrogen silsesquioxane (HSQ), benzocyclobutene (BCB), polyimide, and polyarylether (PAE).

As used herein in all embodiments, a final dielectric includes a third dielectric layer 24 and the cap layer 22 or a spacer, which is also referred to as a dielectric sidewall, dielectric sidewall spacer, a sidewall, a sidewall spacer or the like.

In this first embodiment, the cap layer 22 surrounds the third dielectric layer 24, the conductor 20 on three sides and the conductive barrier layers 18 on two sides. The structure of FIG. 4 is advantageous because the cap layer 22 prevents chemical or mechanical problems at the interface between the third dielectric layer 24 and the conductive barrier layer 18 as well as any interactions between the conductor 20 and subsequent deposited materials during processing.

SECOND EMBODIMENT

Figure 5:
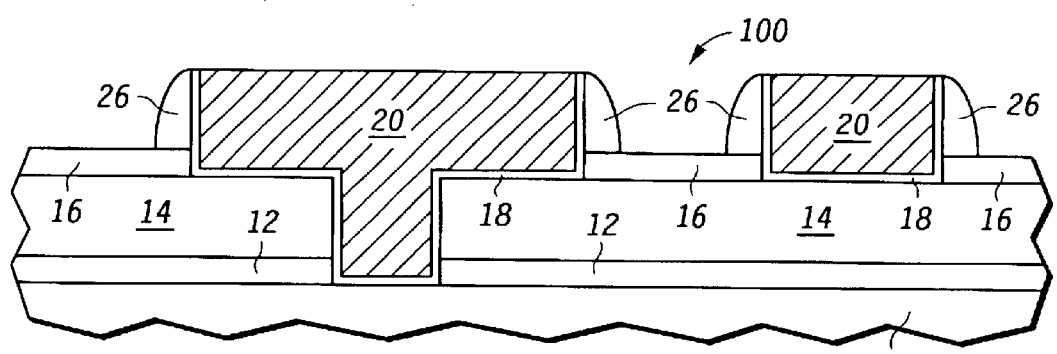
FIG. 5 is a cross-section of a portion of a semiconductor substrate illustrating forming spacers from the structure of FIG. 1 in accordance with the second and third embodiments of the present invention.
Figure 6:
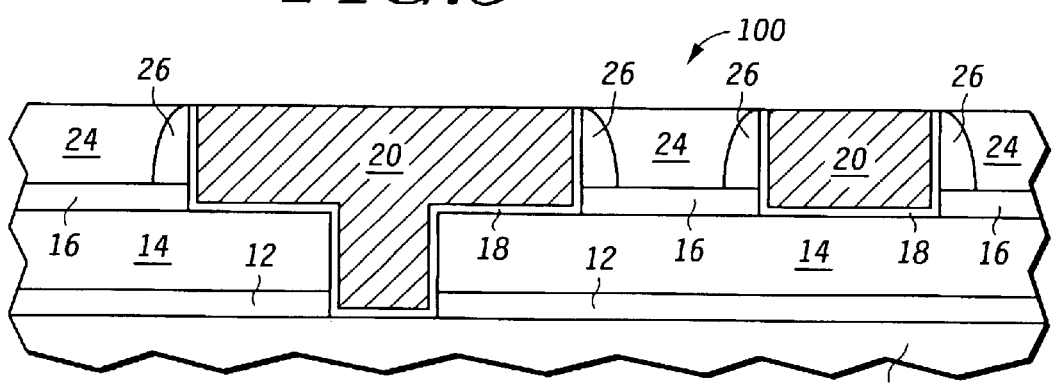
FIG. 6 is a cross-section of a portion of a semiconductor substrate illustrating forming a third dielectric layer in accordance with the second and third embodiments of the present invention.

Shown in FIGS. 5 and 6 is an integrated device structure 5 in consecutive stages of development following device structure 4 of FIG. 3 as a second embodiment of the invention. Shown in FIG. 5 is the integrated device structure 5 after an etch is performed to remove the portions of the cap layer 22 of FIG. 3 that lie over a portion of the opening 100 and over the top of the conductor 20 and the conductive barrier layers 18. The etch can either leave the etch stop layer 16 in the opening 100 or remove portions of the etch stop layer 16. If a portion of the etch stop layer 16 is removed from within the opening 100, the amount of low-K material that can be deposited within the opening 100 increases and the amount of the etch stop layer 16 between the conductors 20 decreases. To etch both the second dielectric 21 and the etch stop layer 16 two different chemistries can be used: a first chemistry that is selective to the second dielectric 21 a second chemistry that is selective to the etch stop layer 16. After removing a portion of the second dielectric 21, and optionally, a portion of the etch stop layer 16, spacers 26 are formed along the sidewalls of the opening 100, as shown in FIG. 5. In the second embodiment, the cap layer 22 has the same physical requirements as in the first embodiment and can be any of the materials listed in the first embodiment.

After etching the cap layer 22 to form the spacers 26, a second cap layer (not shown) can be deposited over the semiconductor substrate 10 in order to protect the conductor 20; it is not necessary in accordance with this embodiment of the invention. Second cap layer can be any of the materials mentioned for the cap layer 22. The cap layer 22 and the second cap layer, however, need not be the same material. This might be necessary if the layer being deposited over the metal structures adversely reacts with the metal structures or the low-K dielectric between the structures. With this structure, the total amount of non-low-K dielectric material in the opening 100 increases, as compared to the structure without the second cap layer.

Shown in FIG. 6 is the device structure 6 after the third dielectric layer 24 is deposited over semiconductor substrate 10 and planarized using the same processes as were discussed in regard to FIG. 4. In accordance with the first embodiment, third dielectric layer 24 is preferably a low-k material and can be any of the materials previously disclosed. A low-k material has the characteristics of reacting with copper, reacting with tantalum or being moisture absorbent.

The advantage of using the spacers 26 is that they result in similar chemical/mechanical properties as in the first embodiment; but increase the amount of a low-K material that is located in the opening 100. In order to decrease capacitance as much as possible, the total amount of low-K material within the opening 100 was increased. Accordingly, the amount of cap layer 22 within the opening 100 was decreased. The overall capacitance within the opening 100 is decreased in the second embodiment as compared to the first embodiment, if all conditions, such as cap layer 22 thickness, are kept constant.

THIRD EMBODIMENT

Shown in FIGS. 5 and 6 is an integrated device structure 5 in consecutive stages of development following the device structure 2 of FIG. 1 as a third embodiment of the invention. Shown in FIG. 5 is the integrated device structure 5 after etching the second dielectric layer 21 to form the spacers 26 without having to deposit an additional layer. Hence, the spacers 26 are the same material as the second dielectric layer 21. The etch process includes a fluorine-containing gas and is anisotropic. To achieve an anisotropic etch a low pressure, which is less than approximately 300 mTorr, and high RF power, which is greater than approximately 500 watts is used in conjunction with an RIE tool with a low density plasma. The process can be endpoint detected or timed.

Shown in FIG. 6 after forming the spacers 26, the third dielectric layer 24, preferably a low-K material, is deposited and planarized, if necessary, using any method or material that were previously disclosed in the other four embodiments.

In a specific implementation, Applied Materials Centura 5200 M×P+ oxide etch chamber is used to etch the second dielectric layer 21 with a process condition of 1,000 W, 200 mTorr, 30 Gauss, 50 sccm Ar, 30 sccm $CHF_3$, and 30 sccm $CF_4$.

FOURTH EMBODIMENT

Figure 7:
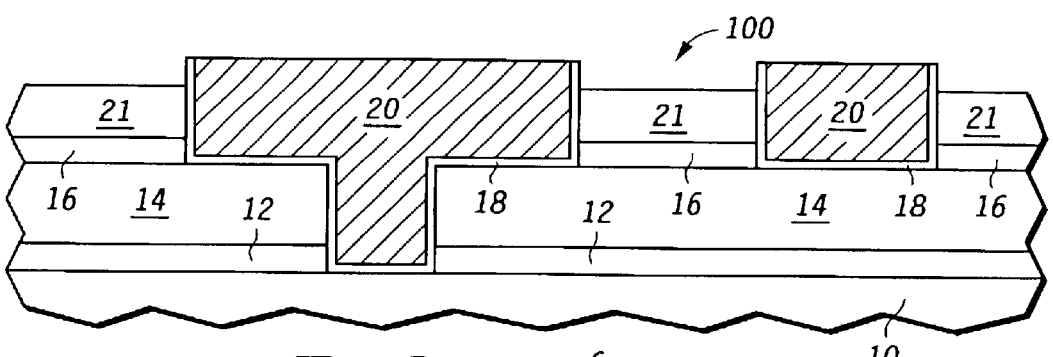
FIG. 7 is a cross-section of a portion of a semiconductor substrate illustrating removing a portion of a second dielectric layer from the structure of FIG. 1 in accordance with a fourth embodiment of the present invention.

Shown in FIGS. 7–11 is an integrated device structure 6 in consecutive stages of development following device structure 2 of FIG. 1 as a fourth embodiment of the invention. Shown in FIG. 7 is the device structure 6 after the second dielectric layer 21 of FIG. 1 is etched in order to recess the second dielectric layer 21 within the opening 100. In other words, a first portion of the second dielectric layer 21 is removed to expose a first portion of a first sidewall of the conductive barrier layer 18 that is adjacent to a first conductor 20, a second portion of a second sidewall of a conductive barrier layer that is adjacent a second conductor 20, and a remaining portion of the first dielectric. The amount of recess of the second dielectric layer 21 should be enough to subsequently deposit a spacer layer 27 and etch the spacer layer 27 to form a spacer as will be discussed in regard to FIGS. 8 and 9. Traditional etch processing known to one of ordinary skill in the art is used to recess second dielectric layer 21. The same etch chemistries used in the second embodiment to etch the second dielectric layer 21 can be used. As in the second embodiment, portions of the etch stop layer 16 can be removed, if desired.

Figure 8:
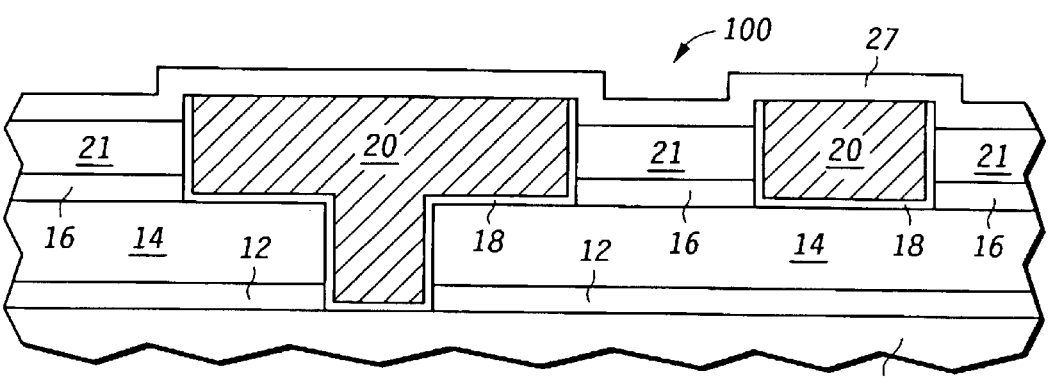
FIG. 8 is a cross-section of a portion of a semiconductor substrate illustrating forming a spacer layer in accordance with the fourth embodiment of the present invention.

Shown in FIG. 8 is the device structure 6 after a spacer layer 27 is deposited using CVD, PECVD, ALD and the like. Any of the materials used for the cap layer 22 can also be used for the spacer layer 27. The thickness of spacer layer 27 should be determined based upon the desired thickness of subsequently formed spacers 28.

Figure 9:
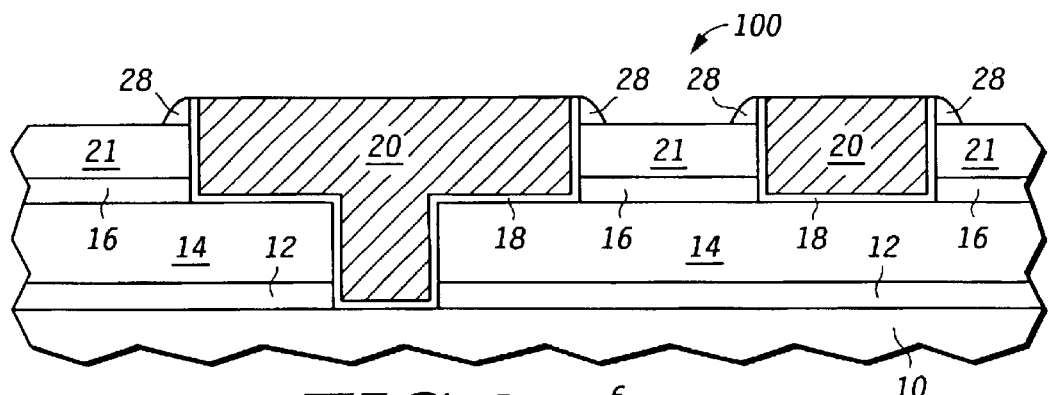
FIG. 9 is a cross-section of a portion of a semiconductor substrate illustrating forming top spacers in accordance with the fourth embodiment of the present invention.

Shown in FIG. 9 is the device structure 6 after an anisotropic etch is used to achieve the spacers 28. If the spacer layer 27 is nitride or more preferably, a non-conductive nitride, a fluorinated chemistry such as $CHF_3$, $CF_4$, $C_2F_6$ or the like, alone or in combination can be used.

Figure 10:
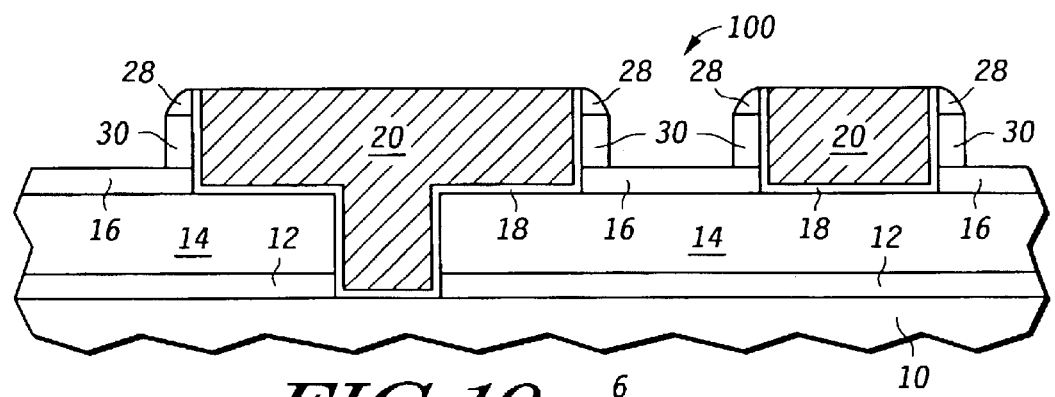
FIG. 10 is a cross-section of a portion of a semiconductor substrate illustrating removing portions of the second dielectric layer to form bottom spacers in accordance with the fourth embodiment of the present invention.

Shown in FIG. 10 is the device structure 6 after the etch chemistry is changed in order to perform an anisotropic etch of the second dielectric layer 21 to result in bottom spacers 30. The etch chemistry chosen is selective to the spacers 28 and anisotropically etches the second dielectric layer 21. A different fluorine containing chemistry can be used. While etching the second dielectric layer 21, the spacers 28 serve as a hard mask in order for a portion of the second dielectric layer 21 to remain underneath the spacers 28. The resulting structure, shown in FIG. 10, differs from the spacers 26 in the second and third embodiments, by the fourth embodiment having spacers that include the top spacer 28 and the bottom spacer 30, which are different materials. In the second and third embodiments, however, the top spacer 28 and bottom spacer 30 are the same material and form the spacer. In this fourth embodiment, the top spacer 28 can be a non-conductive nitride, such as silicon nitride, silicon rich silicon nitride and the like, and the bottom spacer 30 can be silicon dioxide or, more specifically, silicon dioxide formed using TEOS gas.

Optionally, a second cap layer (not shown) can be deposited over the surface of the semiconductor substrate 10 in order to protect the conductor 20 from subsequent processing. Afterwards the third dielectric layer 24, which is preferably a low-K dielectric material, is deposited using any of the methods or materials that were previously discussed in the other two embodiments, as illustrated in FIG. 11.

Figure 11:
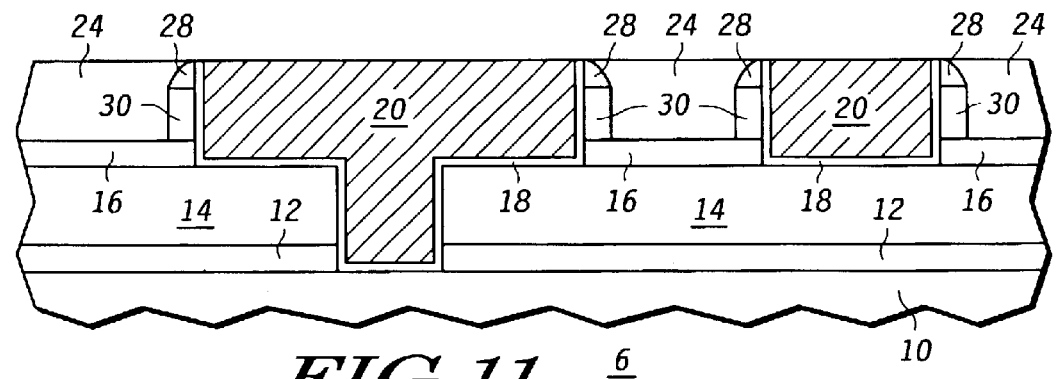
FIG. 11 is a cross-section of a portion of a semiconductor substrate illustrating a third dielectric layer between spacers formed from a second dielectric in accordance with the fourth embodiment of the present invention.

The embodiment shown in FIG. 11 is advantageous over the second and third embodiments shown in FIG. 6 because the overall resulting capacitance is decreased, because the bottom spacers 30 are of a material that is a lower dielectric constant than that of the top spacers 28.

FIFTH EMBODIMENT

Figure 12:
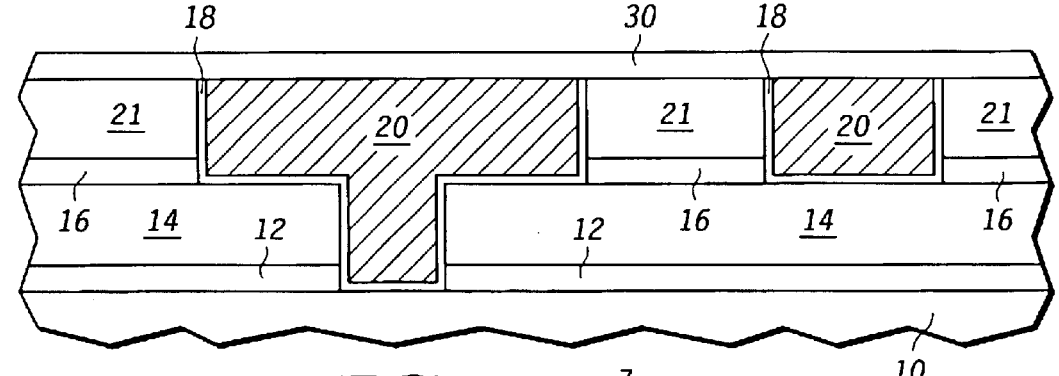
FIG. 12 is a cross-section of a portion of a semiconductor substrate illustrating forming a cap layer in accordance with a fifth embodiment of the present invention.
Figure 13:
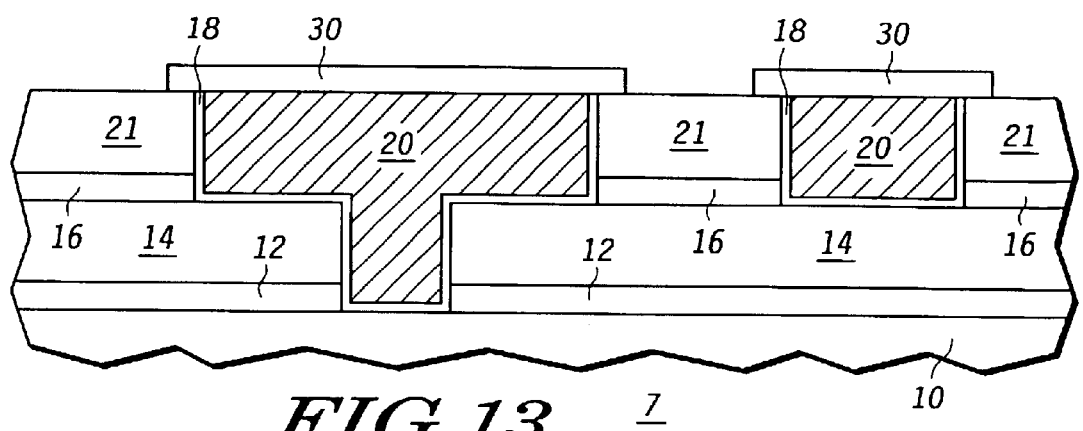
FIG. 13 is a cross-section of a portion of a semiconductor substrate illustrating an etched cap layer in accordance with the fifth embodiment of the present invention.
Figure 14:
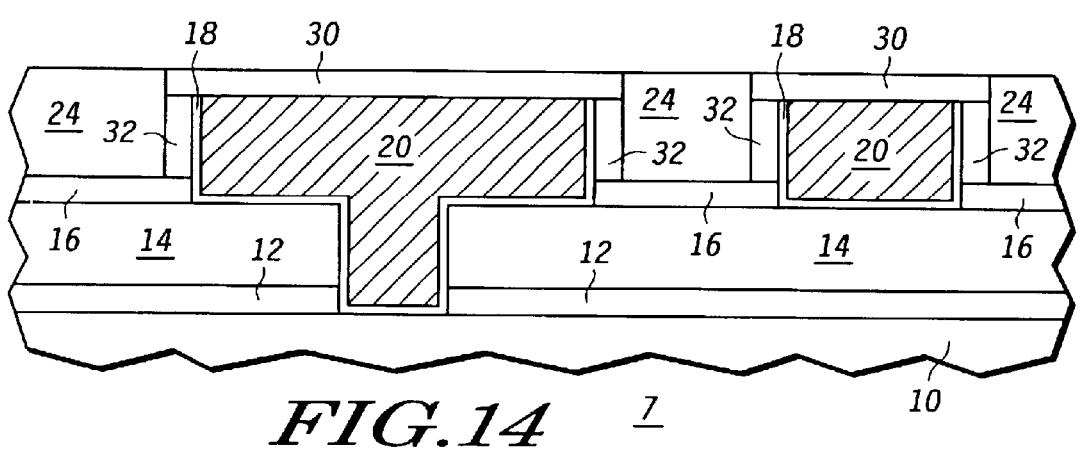
FIG. 14 is a cross-section of a portion of a semiconductor substrate illustrating an etched second dielectric and a deposited third dielectric layer in accordance with the fifth embodiment of the present invention.

Shown in FIGS. 12–14 is an integrated circuit device structure 7 in consecutive stages of development following the device structure 2 of FIG. 1 as a fifth embodiment of the invention. Shown in FIG. 12 is an integrated circuit device structure 7 with a cap layer 30, a non-conducting material, or more preferably, a non-conducting nitride, that is deposited over the second dielectric layer 21 and the first conductor 20 by CVD, PVD, ALD, combinations of the above, or the like.

Shown in FIG. 13 is the device structure 7 after it has been patterned and etched using conventional processing so that remaining portions of the cap layer 30 overlie the conductors 20 and a portion of the second dielectric layer 21, which is adjacent, both sides of conductors 20. In other words, the remaining portions of the cap layer 30 overlies the conductor 20 and overhangs portions of the second dielectric layer 21 that lie near the conductor 20. The amount of overhang combined with the etch process determines the thickness of subsequently formed spacers.

Shown in FIG. 14 is the device structure 7 after the second dielectric layer 21 is etched using a chemistry that is selective to the cap layer 30 so that the cap layer 30 serves as a hard mask. The resulting structure (shown in FIG. 14) includes spacers 32 made from the same material as second dielectric layer 21. The cap layer 30 lies over both the conductors 20 and the spacers 32. Afterwards, the third dielectric layer 24 is deposited within the opening 100, as shown in FIG. 14. Planarization of the third dielectric layer 24 can be performed using the same processes as were previously discussed in regards to FIG. 4.

This embodiment is advantageous because the majority of the spacers are the second dielectric layer 21, which, generally, has a lower dielectric constant than the cap layer 30. Consequently, the capacitance between the conductors 20 is decreased. Thus, the dielectric constant is decreased as compared to using a higher dielectric constant material, such as a nitride, as a spacer.

In all the discussed embodiments, the opening 100 is constrained by two metal interconnect structures and the etch stop layer 16. Instead, it is possible to have the opening 100 constrained on the bottom by the first dielectric layer 14, the second dielectric layer 21 or the layer underneath the first etch stop layer 12. In these embodiments, the opening 100 would be formed by any of the previously discussed processes and would be substantially filled with third dielectric layer 24. Increasing the size of the opening 100 and filling a large portion of it with a low-k material, would further decrease the capacitance between the two interconnect structures.

The discussed embodiments overcome the problem discovered by the inventors that low-k materials tend to disadvantageously react with a conductive barrier layer of a metal structure by absorbing moisture that can harm the surrounding materials. For example, in a copper via or trench surrounded by the conductive barrier layer of tantalum, the moisture absorbed by the low-k material can corrode the tantalum. In addition, at the interface between the low-k material and the conductive barrier layer or the low-k material and the metal, if no barrier layer is present, voiding can occur over time and various temperature cycles due to mechanical or thermal stresses. This voiding can lead to metal migration and dielectric deformation, thus decreasing the reliability of the device.

All embodiments have the advantage of decreasing the parasitic capacitance between metal interconnects by using a low-k material, while decreasing the negative side effects of such a material. For example, the mechanical strength of the resulting structure is increased as compared to traditional structures using low-k materials between interconnects. In addition, the low-k material does not disadvantageously react with the conductive barrier layer of a metal structure or the metal, if no barrier layer is present, by absorbing moisture. This results in decreased voiding leading to decreased metal migration and dielectric deformation. Therefore, the reliability of the device is increased.

Although the embodiments discussed have been limited to one opening between a dual inlaid metal structure and a first metal structure, the embodiments are not limited to processing using a dual inlaid structure, a metal structure, or only one opening. Instead, these embodiments can be used for many openings in a dual inlaid process or a single inlaid process. For example, one application of the embodiments can be used with aluminum metal interconnects. The embodiments can be applied to metal interconnects (metal structures), such as vias and trenches, or any other metal structures, which includes metal interconnects and metal gates. Furthermore, the above process may be used in an inlaid polysilicon process.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit device structure, comprising:
   a first conductor having a first sidewall;
   a second conductor having a second sidewall;
   a first conductive barrier along the first sidewall;
   a second conductive barrier along the second sidewall;
   a first dielectric sidewall spacer along the first conductive barrier, wherein the first dielectric sidewall spacer has a top portion comprising a first material and a lower portion comprising a second material, wherein the first material etches selectively to the second material;
   a second dielectric sidewall spacer along the second conductive barrier; and
   a low-k dielectric having a dielectric constant below 4.0 between the first and second sidewall and adjacent to the first dielectric sidewall spacer and the second dielectric sidewall spacer.

2. The integrated circuit device structure of claim 1, wherein the first conductive barrier comprises tantalum.

3. The integrated circuit device structure of claim 2, wherein the low-k dielectric is selected from SiCOH, HSQ, BCB, aerogel, and xerogel.

4. The integrated circuit device structure of claim 2, wherein the first conductor comprises copper.

5. An integrated circuit device structure, comprising:
 a first metal conductor overlying a contact, and having a first sidewall and a top surface;
 a second metal conductor having a top surface that is substantially coplanar with the top surface of the first metal conductor and having a second sidewall;
 a first dielectric sidewall spacer along the first sidewall, wherein the first dielectric sidewall spacer and the second dielectric sidewall spacer comprise a top portion of a first material and a lower portion of a second material, wherein the first material has a higher dielectric constant than the second material;
 a second dielectric sidewall spacer along the second sidewall; and
 a low-k dielectric having a dielectric constant below 4.0 between the first and second sidewall and adjacent to the first dielectric sidewall spacer and the second dielectric sidewall spacer.

6. The integrated circuit device structure of claim 5, wherein the first metal conductor comprises aluminum.

7. The integrated circuit device structure of claim 5, further comprising a first conductive barrier between the first dielectric sidewall spacer and the first sidewall of the first metal conductor and a second conductive barrier between the second dielectric sidewall spacer and the second sidewall of the second metal conductor.

8. The integrated circuit device structure of claim 7, wherein the first conductive barrier comprises tantalum.

9. The integrated circuit device structure of claim 8, wherein the first dielectric sidewall spacer and the second dielectric sidewall spacer comprise a top portion of a first material and a lower portion of a second material, wherein the first material etches selectively to the second material.

* * * * *